(12) United States Patent
Watanabe

(10) Patent No.: US 9,380,696 B2
(45) Date of Patent: Jun. 28, 2016

(54) FLEXIBLE PRINTED CIRCUIT BOARD AND ELECTRONIC DEVICE

(71) Applicant: CANON KABUSHIKI KAISHA, Tokyo (JP)

(72) Inventor: Shinsaku Watanabe, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 229 days.

(21) Appl. No.: 14/136,957

(22) Filed: Dec. 20, 2013

(65) Prior Publication Data
US 2014/0174796 A1 Jun. 26, 2014

(30) Foreign Application Priority Data

Dec. 26, 2012 (JP) ................. 2012-282789
Oct. 28, 2013 (JP) ................. 2013-223342

(51) Int. Cl.
*H05K 1/02* (2006.01)
*H05K 1/03* (2006.01)

(52) U.S. Cl.
CPC ............ *H05K 1/0269* (2013.01); *H05K 1/0266* (2013.01); *H05K 1/0274* (2013.01); *H05K 1/0393* (2013.01); *H05K 2201/0108* (2013.01); *H05K 2201/09936* (2013.01)

(58) Field of Classification Search
CPC ....................... H05K 1/0274; H05K 1/0269
See application file for complete search history.

(56) References Cited

U.S. PATENT DOCUMENTS 5,768,107 A * 6/1998 Ouchi et al. ................. 361/792
2011/0120764 A1 * 5/2011 Kelley et al. ................. 174/377

FOREIGN PATENT DOCUMENTS

JP 09-205261 A 8/1997

* cited by examiner

*Primary Examiner* — Jeremy C Norris
(74) *Attorney, Agent, or Firm* — Cowan, Liebowitz & Latman, P.C.

(57) ABSTRACT

A flexible printed circuit board having a copper foil character with good visibility and without copper foil pattern peeling. The flexible printed circuit board has a base material having optical transparency, a wiring pattern formed on one surface of the base material; a first opaque cover lay film covering a surface of the wiring pattern, a character formed on the other surface of the base material; and a second opaque cover lay film covering a surface of the character. The first opaque cover lay film has an opening portion is formed therein, and the character is formed so as to be visually recognizable through the opening portion.

19 Claims, 16 Drawing Sheets

FLEXIBLE PRINTED CIRCUIT BOARD AND ELECTRONIC DEVICE

BACKGROUND OF THE INVENTION

1. Field of the Invention

The present invention relates to a flexible printed circuit board having flexibility for use in wiring inside an electronic device or the like, and an electronic device incorporating the flexible printed circuit.

2. Description of the Related Art

Conventionally, flexible printed circuit boards having flexibility have frequently been used for wiring for conducting electrical signals inside an electronic device or the like. The flexible printed circuit board is structured with a copper foil pattern formed by etching a copper foil on a polyimide film serving as a base material and a translucent cover lay film compression-fixed and covered thereon. The copper foil pattern on the flexible printed circuit board may be formed not only for the purpose of forming wiring signals but also for the purposes other than conducting electrical signals, such as putting a product symbol, a fold index serving as a mark for use in folding the flexible printed circuit board, and the like.

Meanwhile, recently, a colored opaque cover lay film may be used as a cover lay film for covering the flexible printed circuit board. In such a case where the flexible printed circuit board is exposed outside the device, the copper foil pattern and the wiring circuit are no longer visible from outside the device by covering the printed circuit board with a colored (e.g., black) opaque cover lay film, thereby preventing the design from being impaired.

Regarding the symbols and the like formed on the flexible printed circuit board, there is disclosed a technique for providing a flexible printed circuit board (for example, see Japanese Laid-Open Patent Publication (Kokai) No. 9-205261), on a surface of which a photosensitive cover lay film is provided and marks such as letters and symbols are formed in an opening formed in the photosensitive cover lay film.

However, if the flexible printed circuit board is structured such that the copper foil pattern is covered with an opaque cover lay film, the product symbol as well as the fold index formed by the copper foil pattern on the flexible printed circuit board is also invisible. As a result, this structure causes a problem that assembly operators and manufacturers cannot visually see the fold index.

The technique disclosed in Japanese Laid-Open Patent Publication (Kokai) No. 9-205261 has a problem that if a complicated character string is to be formed on the flexible printed circuit board, the character string cannot be formed in an opening of the cover lay film.

In a case of a structure in which an opening is formed in a cover lay film and letters or indices are formed in the opening portion by a copper foil pattern, when the flexible printed circuit board is bent and turned around inside an electronic device, the copper foil pattern having the letters or indices formed thereon is peeled off from the opening portion of the cover lay film. As a result, the peeled copper foil pattern may contact an electronic element inside the electronic device, resulting in a possible short circuit or the like.

SUMMARY OF THE INVENTION

The present invention provides a flexible printed circuit board having a copper foil character with good visibility and without copper foil pattern peeling, and an electronic device incorporating the flexible printed circuit board.

In an aspect of the invention, there is provided a flexible printed circuit board having a plurality of layers, the flexible printed circuit board comprising: a base material having optical transparency; a wiring pattern formed on one surface of the base material; a first opaque cover lay film covering a surface of the wiring pattern; a character formed on the other surface of the base material; and a second opaque cover lay film covering a surface of the character, wherein the first opaque cover lay film has an opening portion is formed therein, and the character is formed so as to be visually recognizable through the opening portion.

The present invention can provide a flexible printed circuit board having a copper foil character with good visibility and without copper foil pattern peeling.

Further features of the present invention will become apparent from the following description of exemplary embodiments with reference to the attached drawings.

BRIEF DESCRIPTION OF THE DRAWINGS

FIGS. 2A to 2C are views showing the flexible printed circuit board according to the first embodiment of the present invention, respectively, in which FIG. 2A shows a first layer of the flexible printed circuit board as seen from the direction of arrow A in FIG. 1, FIG. 2B shows a second layer of the flexible printed circuit board as seen from the direction of arrow B in FIG. 1, and FIG. 2C is a through view of the first layer and the second layer of the flexible printed circuit board.

FIGS. 4A to 4D are views showing the flexible printed circuit board according to the second embodiment of the present invention, respectively, in which FIG. 4A shows a first layer of the flexible printed circuit board as seen from the direction of arrow A in FIG. 1, FIG. 4B shows a second layer of the flexible printed circuit board as seen from the direction of arrow A in FIG. 1, FIG. 4C shows a third layer of the flexible printed circuit board as seen from the direction of arrow B in FIG. 1, and FIG. 4D is a through view of the first layer, the second layer, and the third layer of the flexible printed circuit board.

FIGS. 6A to 6C are views showing the flexible printed circuit board according to the third embodiment of the present invention, respectively, in which FIG. 6A shows a first layer of the flexible printed circuit board, FIG. 6B shows a second layer of the flexible printed circuit board, and FIG. 6C is a through view of the first layer and the second layer of the flexible printed circuit board.

FIGS. 7A to 7C are views showing the flexible printed circuit board according to the fourth embodiment of the present invention, respectively, in which FIG. 7A shows a first layer of the flexible printed circuit board, FIG. 7B shows a second layer of the flexible printed circuit board, and FIG. 7C is a through view of the first layer and the second layer of the flexible printed circuit board.

FIGS. 9A to 9D are views showing the flexible printed circuit board according to the fifth embodiment of the present invention, respectively, in which FIG. 9A shows a first layer of the flexible printed circuit board as seen from the direction of arrow A in FIG. 1, FIG. 9B shows a second layer of the flexible printed circuit board as seen from the direction of arrow A in FIG. 1, FIG. 9C shows a third layer of the flexible printed circuit board as seen from the direction of arrow B in FIG. 1, and FIG. 9D is a through view of the first layer, the second layer, and the third layer of the flexible printed circuit board.

FIGS. 11A to 11C are views showing the flexible printed circuit board according to the sixth embodiment of the present invention, respectively, in which FIG. 11A shows a first layer of the flexible printed circuit board as seen from the direction of arrow A in FIG. 1, FIG. 11B shows a first layer of the flexible printed circuit board as seen from the direction of arrow B in FIG. 1, and FIG. 11C is a through view of the first layer and a second layer of the flexible printed circuit board.

FIGS. 13A to 13D are views showing the flexible printed circuit board according to the seventh embodiment of the present invention, respectively, in which FIG. 13A shows a first layer of the flexible printed circuit board as seen from the direction of arrow A in FIG. 1, FIG. 13B shows a second layer of the flexible printed circuit board as seen from the direction of arrow A in FIG. 1, FIG. 13C shows a third layer of the flexible printed circuit board as seen from the direction of arrow B in FIG. 1, and FIG. 13D is a through view of the first layer, the second layer, and the third layer of the flexible printed circuit board.

FIGS. 15A to 15D are views showing the flexible printed circuit board according to the eighth embodiment of the present invention, respectively, in which FIG. 15A shows a first layer of the flexible printed circuit board as seen from the direction of arrow A in FIG. 1, FIG. 15B shows a second layer of the flexible printed circuit board as seen from the direction of arrow A in FIG. 1, FIG. 15C shows a third layer of the flexible printed circuit board as seen from the direction of arrow B in FIG. 1, and FIG. 15D is a through view of the first layer, the second layer, and the third layer of the flexible printed circuit board.

DESCRIPTION OF THE EMBODIMENTS

The embodiments of the present invention will now be described in detail with respect to the accompanying drawings.

In a first embodiment of the invention, the description focuses on an example assuming that the flexible printed circuit board is a two-layer board.

Figure 1:
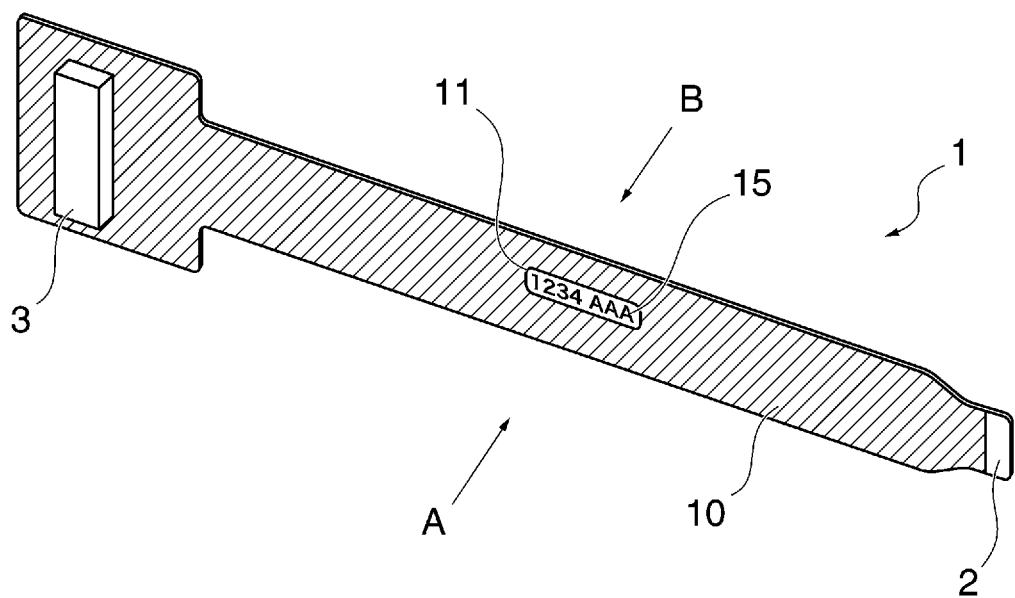
FIG. 1 is a perspective view showing an appearance of a flexible printed circuit board common to a first to an eighth embodiment of the present invention.
Figure 8:
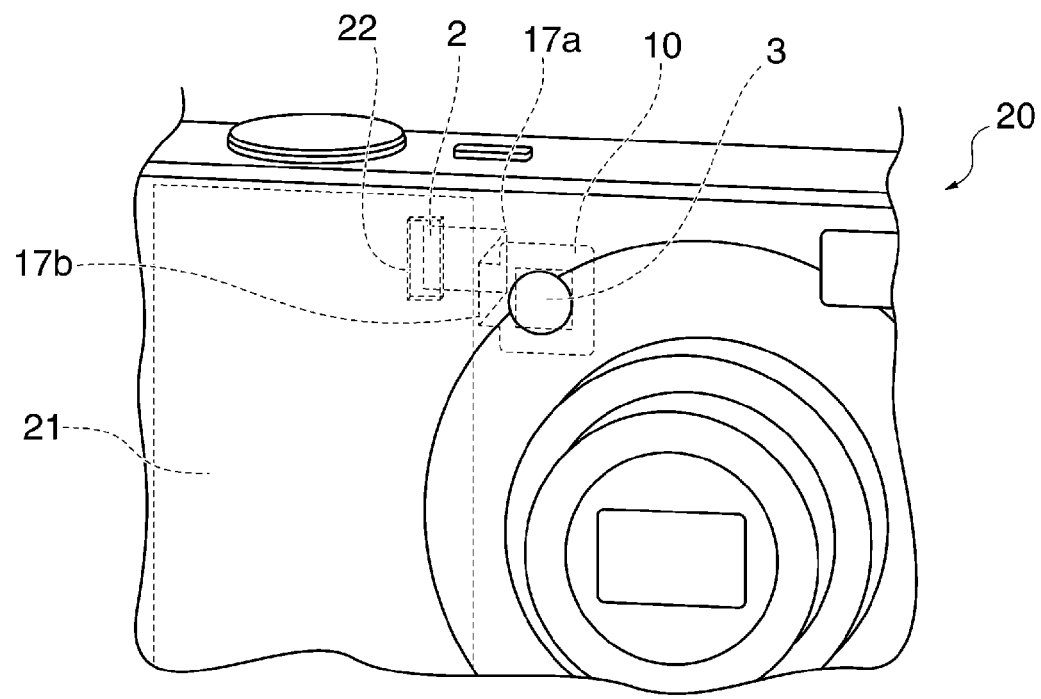
FIG. 8 is a schematic view showing a configuration of essential parts of an electronic device incorporating the flexible printed circuit board.

FIG. 1 is a perspective view showing an appearance of the flexible printed circuit board common to a first to an eighth embodiment of the present invention. FIG. 8 is a schematic view showing a configuration of essential parts of an electronic device incorporating the flexible printed circuit board.

In FIG. 1, a flexible printed circuit board 1 includes a colored opaque cover lay film 10 compressed and covered on both front and rear surfaces thereof, a terminal portion 2, and an electronic component 3 mounted thereon. An opening portion 11 is provided in the colored cover lay film 10 of the flexible printed circuit board 1 which is configured such that a character 15 is displayed through the opening portion 11.

As shown in FIG. 8, the flexible printed circuit board 1 is configured to be foldable by fold portions 17a and 17b, and is incorporated into an electronic device 20 as a wiring board for use in conducting electrical signals inside the electronic device 20. An electronic board 21 mounting a connector 22 thereon is disposed inside the electronic device 20. The flexible printed circuit board 1 is disposed in a state where the inside of the electronic device 20 is bent at the fold portions 17a and 17b. Electrical signals are conducted by connecting the terminal portion 2 of the flexible printed circuit board 1 to the connector 22 mounted on the electronic board 21. The detail of the flexible printed circuit board 1 will be described later.

Figure 2A:
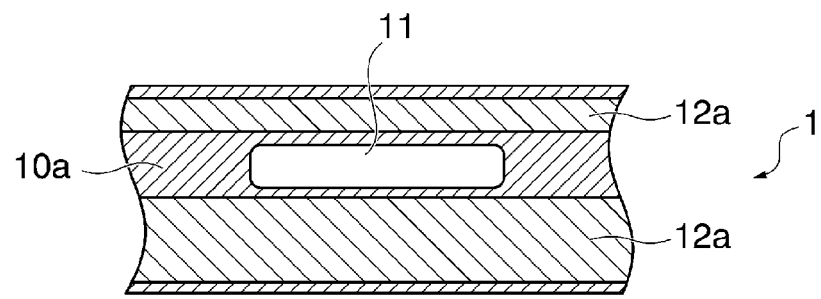
Figure 2B:
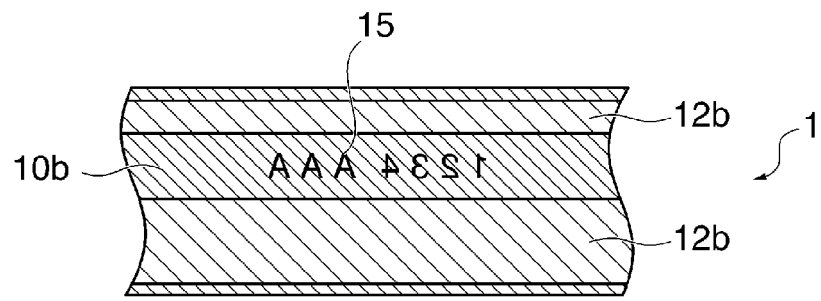
Figure 2C:
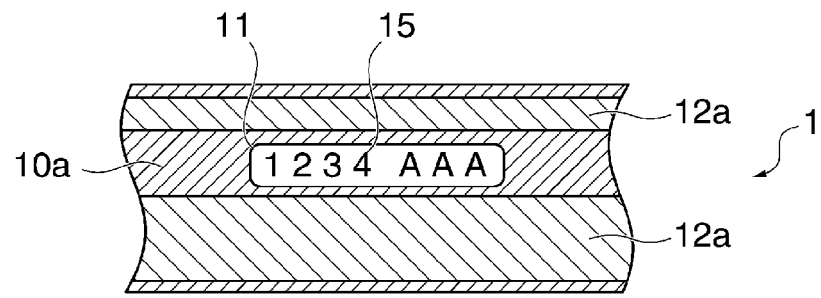
Figure 3:
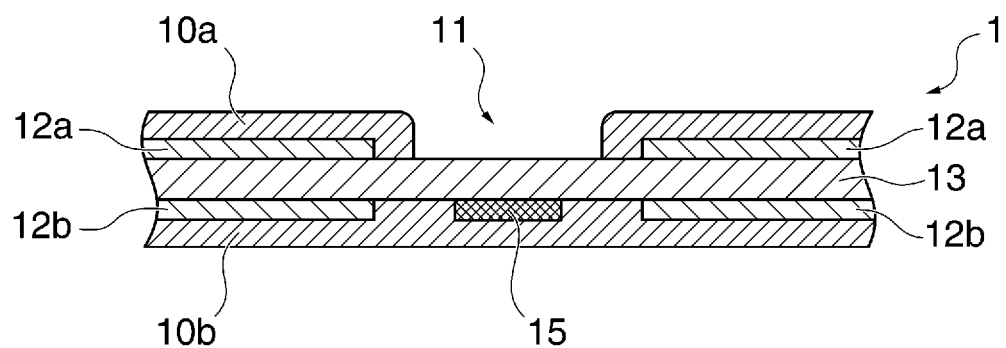
FIG. 3 is a cross-sectional view of the flexible printed circuit board according to the first embodiment of the present invention.

FIGS. 2A to 2C are views showing the flexible printed circuit board according to the first embodiment, respectively, in which FIG. 2A shows a first layer of the flexible printed circuit board as seen from the direction of arrow A in FIG. 1, FIG. 2B shows a first layer of the flexible printed circuit board as seen from the direction of arrow B in FIG. 1, and FIG. 2C is a view of the flexible printed circuit board in a state in which the first layer and the second layer are superimposed with each other as seen from the direction of arrow A in FIG. 1. FIG. 3 is a cross-sectional view of the flexible printed circuit board according to the first embodiment.

In FIGS. 2A to 2C, and 3, the flexible printed circuit board 1 is configured such that copper foil patterns 12a and 12b, colored cover lay films 10a and 10b, and a character 15 are formed on a base material 13. The base material 13 is composed of a high polymer material having optical transparency such as polyimide or a synthetic resin material having optical transparency such as PET resin. A first layer copper foil pattern 12a is formed on one surface side of the base material 13 and a second layer copper foil pattern 12b is formed on the other surface of the base material 13.

As shown in FIG. 3, the colored cover lay film 10a is bonded to a surface of the first layer copper foil pattern 12a with an adhesive (not shown), and the first layer copper foil pattern 12a is covered with the colored cover lay film 10a. The colored cover lay film 10b is bonded to a surface of the second layer copper foil pattern 12b with an adhesive (not shown), and the second layer copper foil pattern 12b and the character 15 are covered with the colored cover lay film 10b. The colored cover lay films 10a and 10b are colored so as to be opaque or to have extremely low optical transparency.

As shown in FIG. 2A and 3, the first layer copper foil pattern 12a is formed on the first layer. The opening portion 11 is formed in the colored cover lay film 10a. The character 15 is formed with copper foil in a region corresponding to the opening portion 11 of the colored cover lay film 10a.

As shown in FIG. 2B and 3, the second layer copper foil pattern 12b and the character 15 are formed on the second layer. The character 15 is formed in a region corresponding to the opening portion 11 within a longitudinal range in a direction parallel to the surface of the flexible printed circuit board 1 in the opening portion 11. Specifically, the character 15 is formed in a state of being sealed between the base material 13 which is transparent or has high optical transparency and the colored cover lay film 10b which is opaque or has extremely low optical transparency. The character 15 is formed in a projection of the opening portion 11, and hence the character 15 can be visually recognized through the opening portion 11.

The present embodiment uses a combination of numbers and letters (e.g., 1234 AAA) as an example of the character 15, but is not limited thereto.

The character 15 can be selected from a group including numbers, letters, symbols, marks, and a combination of any of the numbers, the letters, the symbols, and the marks. The character 15 can also be selected from a group including a fold index serving as a mark for use in folding the flexible printed circuit board 1 and a product symbol. The character 15 is formed such that the numbers and the letters are seen with left and right reversed as viewed from the direction of arrow B in FIG. 1.

The first layer copper foil pattern 12a corresponds to a wiring pattern. The second layer copper foil pattern 12b corresponds to another wiring pattern. The colored cover lay film 10a corresponds to a first opaque cover lay film. The colored cover lay film 10b corresponds to a second opaque cover lay film.

When the flexible printed circuit board 1 is seen from the direction of arrow A in FIG. 1, the above configuration as shown in FIG. 2C allows the character 15 formed with the second layer copper foil to be visually seen through the opening portion 11 formed on the colored cover lay film 10a. The character 15 is sealed between the base material 13 and the colored cover lay film 10b, which prevents the character 15 from being peeled off.

As described above, the present embodiment can provide a flexible printed circuit board having a copper foil character with good visibility and without copper foil pattern peeling.

In a second embodiment of the invention, the description focuses on an example assuming that the flexible printed circuit board is a three-layer board.

Figure 4A:
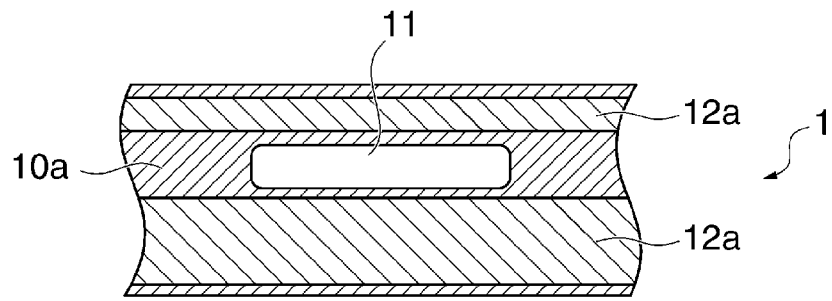
Figure 4B:
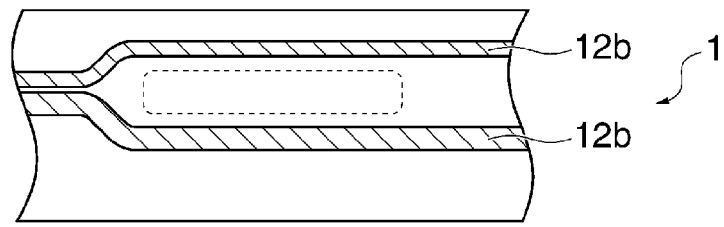
Figure 4C:
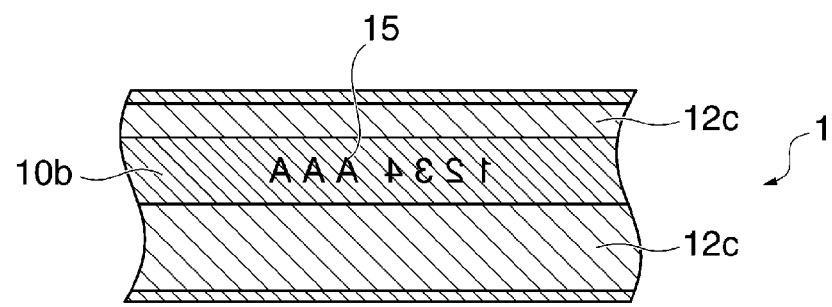
Figure 4D:
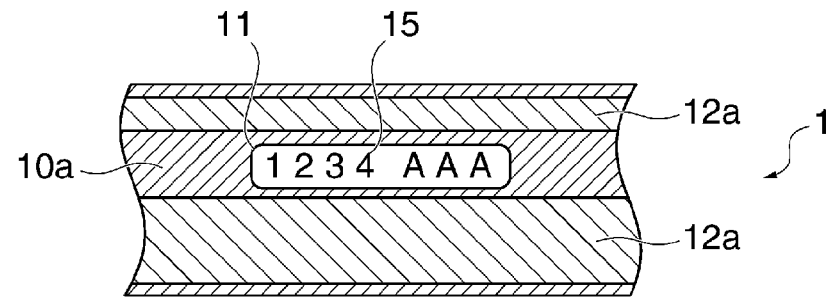
Figure 5:
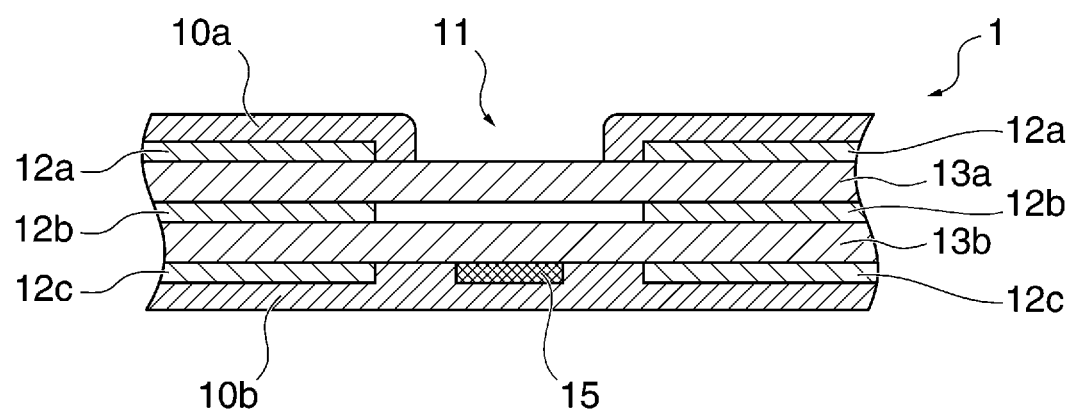
FIG. 5 is a cross-sectional view of the flexible printed circuit board according to the second embodiment of the present invention.

FIGS. 4A-4D are views showing a flexible printed circuit board according to the second embodiment, respectively, in which FIG. 4A shows a first layer of the flexible printed circuit board as seen from the direction of arrow A in FIG. 1, FIG. 4B shows a second layer of the flexible printed circuit board as seen from the direction of arrow A in FIG. 1, FIG. 4C shows a third layer of the flexible printed circuit board as seen from the direction of arrow B in FIG. 1, and FIG. 4D is a view of the flexible printed circuit board in a state in which the first layer, the second layer, and the third layer are superimposed with one another as seen from the direction of arrow A in FIG. 1. FIG. 5 is a cross-sectional view of the flexible printed circuit board according to the second embodiment. In the present embodiment, the same reference numerals or characters are assigned to the members having the same functions as those in the first embodiment, descriptions of which are omitted.

In FIGS. 4A to 4D, and 5, the flexible printed circuit board 1 is configured such that the copper foil patterns 12a, 12b, and 12c, the colored cover lay films 10a and 10b, and the character 15 are formed on the base materials 13a and 13b. The base materials 13a and 13b are composed of a high polymer material having optical transparency such as polyimide or a synthetic resin material having optical transparency such as PET resin. The first layer copper foil pattern 12a is formed on one surface of the base material 13a and the second layer copper foil pattern 12b is formed on the other surface of the base material 13a. It should be noted that the base material 13b is disposed on the other surface of the base material 13a so as to cover the second layer copper foil pattern 12b. In short, the base material 13b is disposed on the other surface of the base material 13a. The second layer copper foil pattern 12b is formed between the base material 13a and the base material 13b.

As shown in FIG. 5, one surface of the base material 13b is bonded, with an adhesive (not shown), to a surface on a side opposite to the surface facing the base material 13a, in the second layer copper foil pattern 12b. The third layer copper foil pattern 12c is formed on the other surface of the base material 13b. The colored cover lay film 10a is bonded to a surface of the first layer copper foil pattern 12a with an adhesive (not shown), and the first layer copper foil pattern 12a is covered with the colored cover lay film 10a. The colored cover lay film 10b is bonded to a surface of the third layer copper foil pattern 12c with an adhesive (not shown), and the third layer copper foil pattern 12c and the character 15 are covered with the colored cover lay film 10b. Thus, the character 15 is sealed between the base material 13b and the colored cover lay film 10b.

As shown in FIG. 4A and 5, the opening portion 11 is formed in the colored cover lay film 10a. As shown in FIG. 4B and 5, the second layer copper foil pattern 12b in a position facing the opening portion 11 in the colored cover lay film 10a is routed so as to avoid (bypass) a region corresponding to the opening portion 11.

As shown in FIG. 4C and 5, the character 15 is formed with copper foil on the third layer in a position facing the opening portion 11 in the colored cover lay film 10a. The character 15 is formed in a region corresponding to the opening portion 11 within a longitudinal range in a direction parallel to the surface of the flexible printed circuit board 1 in the opening portion 11. Specifically, the character 15 is formed in a projection of the opening portion 11, the second layer copper foil pattern 12b is formed so as to bypass the region corresponding to the opening portion 11, and hence the character 15 can be visually recognized through the opening portion 11. The present embodiment uses a combination of numbers and letters (e.g., 1234 AAA) as an example of the character 15, but is not limited thereto.

The character 15 can be selected from numbers, letters, symbols, marks, and a combination of any of the numbers, the letters, the symbols, and the marks. The character 15 can also be selected from a group including a fold index serving as a mark for use in folding the flexible printed circuit board 1 and a product symbol. The character 15 is formed such that the numbers and the letters are seen with left and right reversed as viewed from the direction of arrow B in FIG. 1.

When the flexible printed circuit board 1 is seen from the direction of arrow A in FIG. 1, the above configuration as shown in FIG. 4D allows the character 15 formed with the third layer copper foil to be visually seen through the opening portion 11 formed on the colored cover lay film 10a.

The base material 13a corresponds to a first base material. The base material 13b corresponds to a second base material. The first layer copper foil pattern 12a corresponds to a first wiring pattern. The second layer copper foil pattern 12b corresponds to a second wiring pattern. The third layer copper foil pattern 12c corresponds to a third wiring pattern. The colored cover lay film 10a corresponds to a first opaque cover lay film. The colored cover lay film 10b corresponds to a second opaque cover lay film.

As described above, the present embodiment can provide a flexible printed circuit board having a copper foil character with good visibility and without copper foil pattern peeling.

In a third embodiment of the invention, the description focuses on an example assuming that the flexible printed circuit board is a two-layer board.

Figure 6A:
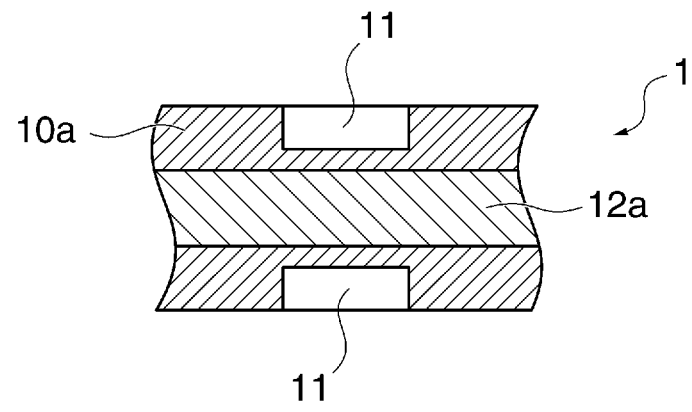
Figure 6B:
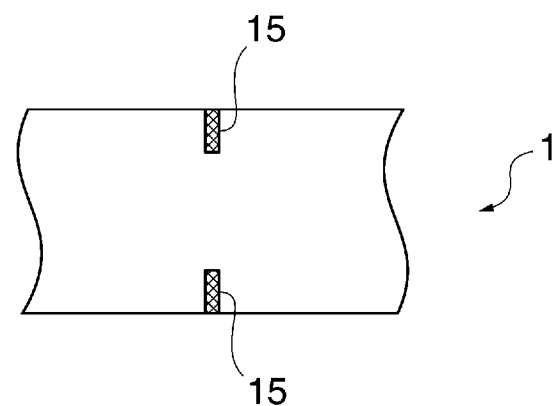
Figure 6C:
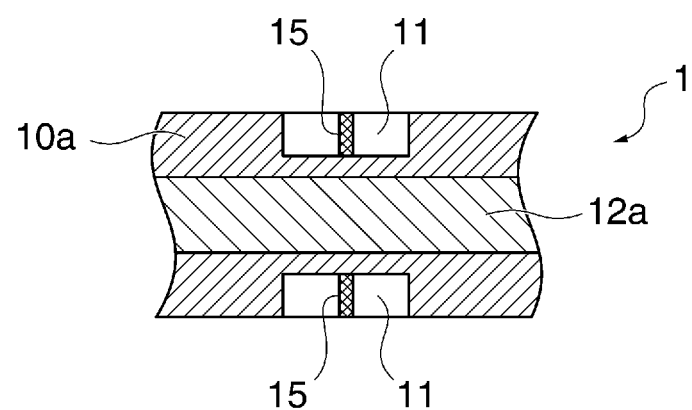

FIGS. 6A to 6C are views showing the flexible printed circuit board according to the third embodiment, respectively, in which FIG. 6A shows a first layer of the flexible printed circuit board, FIG. 6B shows a second layer of the flexible printed circuit board, and FIG. 6C is a view of the flexible printed circuit board in a state in which the first layer and the second layer are superimposed with each other as seen from the direction of arrow A in FIG. 1. In the present embodiment, the same reference numerals or characters are assigned to the members having the same functions as those in the first embodiment, descriptions of which are omitted. It should be noted that in FIGS. 6A to 6C, the following base material 13, the copper foil pattern 12b, and the colored cover lay film 10b are not shown.

In FIGS. 6A to 6C, the base material 13 of the flexible printed circuit board 1 is composed of a high polymer material having optical transparency such as polyimide or a synthetic resin material having optical transparency such as PET resin. A first layer copper foil pattern 12a is formed on one surface of the base material 13 and a second layer copper foil pattern 12b is formed on the other surface of the base material 13. The colored cover lay film 10a is bonded to the first layer copper foil pattern 12a with an adhesive (not shown), and the first layer copper foil pattern 12a is covered with the colored cover lay film 10a. The colored cover lay film 10b is bonded to the second layer copper foil pattern 12b with an adhesive (not shown), and the second layer copper foil pattern 12b and the character 15 are covered with the colored cover lay film 10b.

Note that the opening portion 11 is formed in the colored cover lay film 10a, and reaches an outside portion (outer peripheral edge) of the flexible printed circuit board 1. The character 15 formed with copper foil is formed in a region corresponding to the opening portion 11 in the colored cover lay film 10a so as to be larger than the opening portion 11, and reaches an outside portion (outer peripheral edge) of the flexible printed circuit board 1. In short, the character 15 reaches the outside portion of the flexible printed circuit board 1 and is formed in a region corresponding to the opening portion 11. In other words, the character 15 is formed in a projection surface of the opening portion 11, and hence the character 15 can be visually recognized through the opening portion 11.

The character 15 can be selected from numbers, letters, symbols, marks, and a combination of any of the numbers, the letters, the symbols, and the marks. The character 15 can also be selected from a group including a fold index serving as a mark for use in folding the flexible printed circuit board 1 and a product symbol.

When seen from the first layer side of the flexible printed circuit board 1 as shown in FIG. 6C, the above configuration allows the character 15 formed with the second layer copper foil to be visually seen through the opening portion 11 formed in the colored cover lay film 10a. The opening portion 11 and the character 15 are set to an outside portion (outer peripheral edge) of the flexible printed circuit board 1, and hence can be used, for example, as a fold index for use in folding the flexible printed circuit board 1, which enables the operator to visually confirm the character 15.

As described above, the present embodiment can provide a flexible printed circuit board having a copper foil character with good visibility and without copper foil pattern peeling.

In a fourth embodiment of the invention, the description focuses on an example assuming that the flexible printed circuit board is a two-layer board.

Figure 7A:
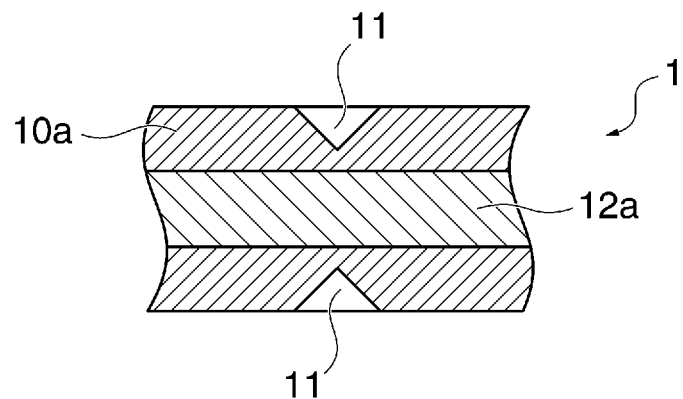
Figure 7B:
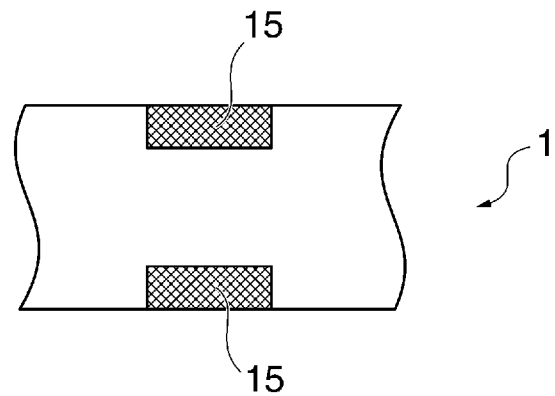
Figure 7C:
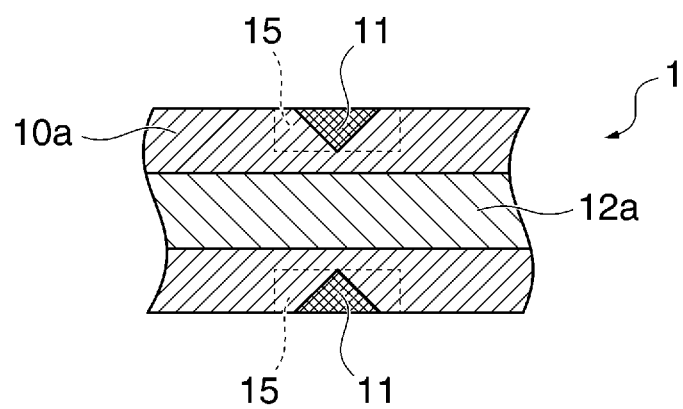

FIGS. 7A to 7C are views showing the flexible printed circuit board according to the fourth embodiment, respectively, in which FIG. 7A shows a first layer of the flexible printed circuit board, FIG. 7B shows a second layer of the flexible printed circuit board, and FIG. 7C is a view of the flexible printed circuit board in a state in which the first layer and the second layer are superimposed with each other as seen from the direction of arrow A in FIG. 1. In the present embodiment, the same reference numerals or characters are assigned to the members having the same functions as those in the first embodiment, descriptions of which are omitted. It should be noted that in FIGS. 7, the following base material 13, the copper foil pattern 12b, and the colored cover lay film 10b are not shown.

In FIGS. 7A to 7C, the base material 13 of the flexible printed circuit board 1 is composed of a high polymer material having optical transparency such as polyimide or a synthetic resin material having optical transparency such as PET resin. A first layer copper foil pattern 12a is formed on one surface of the base material 13 and a second layer copper foil pattern 12b is formed on the other surface side of the base material 13. The colored cover lay film 10a is bonded to the first layer copper foil pattern 12a with an adhesive (not shown), and the first layer copper foil pattern 12a is covered with the colored cover lay film 10a. The colored cover lay film 10b is bonded to the second layer copper foil pattern 12b with an adhesive (not shown), and the second layer copper foil pattern 12b and the character 15 are covered with the colored cover lay film 10b.

Note that the opening portion 11 is formed in the colored cover lay film 10a so as to extend to an outside portion (outer peripheral edge) of the flexible printed circuit board 1. The character 15 formed with copper foil is formed in the second layer at a position facing the opening portion 11 of the colored cover lay film 10a, the character 15 being formed as a pattern in a range larger than the opening portion 11 and further reaching the outside portion (outer peripheral edge). In short, the character 15 is formed extending to the outside portion of the flexible printed circuit board 1 and facing the opening portion 11 as well. Thus, part of the character 15 can be visually recognized through the opening portion 11.

The character 15 can be selected from numbers, letters, symbols, marks, and a combination of any of the numbers, the letters, the symbols, and the marks. The character 15 can also be selected from a group including a fold index serving as a mark for use in folding the flexible printed circuit board 1 and a product symbol.

When seen from the first layer side of the flexible printed circuit board 1 as shown in FIG. 7C, the above configuration allows the shape of the opening portion 11 formed on the colored cover lay film 10a to be visually seen by a contrast difference between the opening portion 11 and the character 15 formed with the second layer copper foil. The shape of the opening portion 11 formed in the colored cover lay film 10a can be used, for example, as a fold index for use in folding the flexible printed circuit board 1. Further, the second layer character 15 is formed as a pattern larger than the opening portion 11, which prevents a problem such as a disconnection of the flexible printed circuit board.

As described above, the present embodiment can provide a flexible printed circuit board having a copper foil character with good visibility and without copper foil pattern peeling.

In a fifth embodiment of the invention, the description focuses on an example assuming that the flexible printed circuit board is a three-layer board.

Figure 9A:
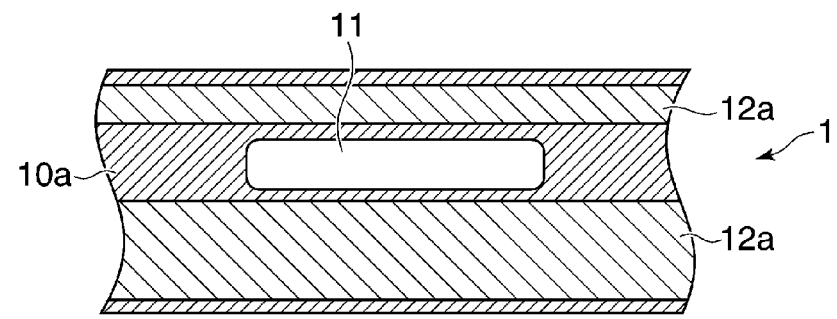
Figure 9B:
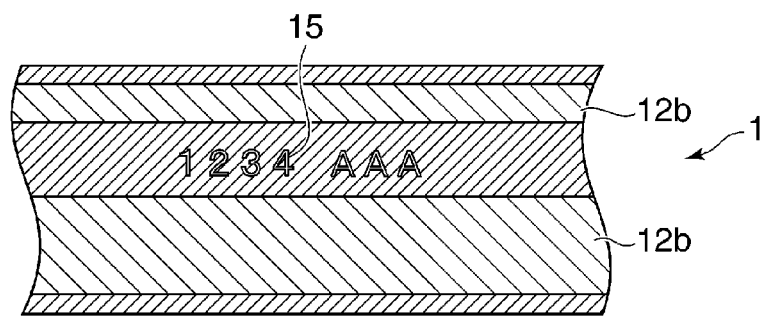
Figure 9C:
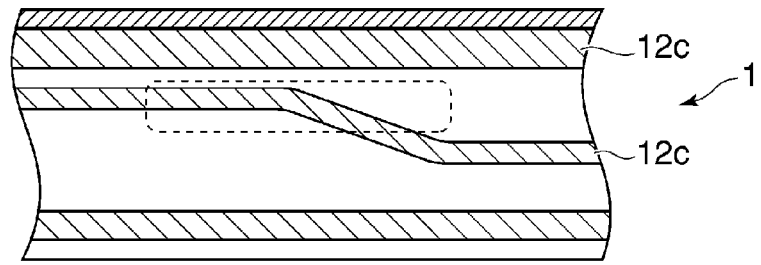
Figure 9D:
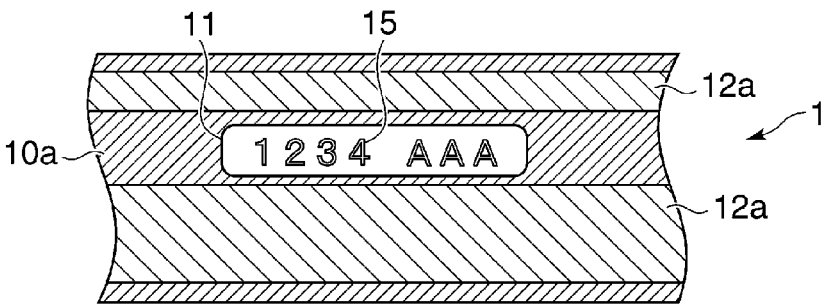

FIGS. 9A to 9D are views showing the flexible printed circuit board according to the fifth embodiment, respectively, in which FIG. 9A shows a first layer of the flexible printed circuit board as seen from the direction of arrow A in FIG. 1, FIG. 9B shows a second layer of the flexible printed circuit board as seen from the direction of arrow A in FIG. 1, FIG. 9C shows a third layer of the flexible printed circuit board as seen from the direction of arrow A in FIG. 1, and FIG. 9D is a view of the flexible printed circuit board in a state in which the first layer, the second layer, and the third layer are superimposed with one another as seen from the direction of arrow A in FIG. 1.

Figure 10:
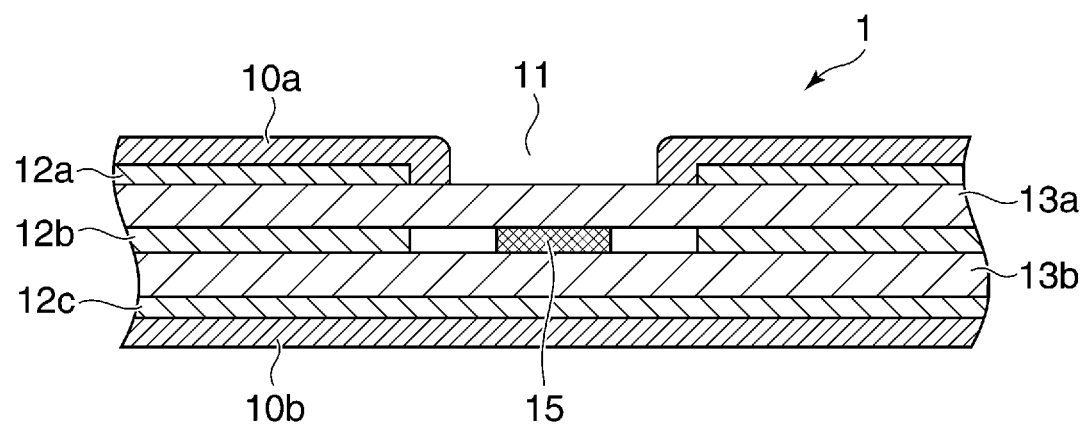
FIG. 10 is a cross-sectional view of the flexible printed circuit board according to the fifth embodiment of the present invention.

FIG. 10 is a cross-sectional view of the flexible printed circuit board according to the fifth embodiment. In the present embodiment, the same reference numerals or characters are assigned to the members having the same functions as those in the first embodiment, descriptions of which are omitted.

In FIGS. 9A to 9D, and 10, the flexible printed circuit board 1 is configured such that the copper foil patterns 12a, 12b, and 12c, the colored cover lay films 10a and 10b, and the character 15 are formed on the base materials 13a and 13b. The base materials 13a and 13b are composed of a high polymer material having optical transparency such as polyimide or a synthetic resin material having optical transparency such as PET resin.

As shown in FIG. 10, the first layer copper foil pattern 12a is formed on one surface of the base material 13a and the second layer copper foil pattern 12b is formed on the other surface of the base material 13a. The base material 13b is disposed on the other surface of the base material 13a so as to cover the second layer copper foil pattern 12b. In other words, the second layer copper foil pattern 12b is formed between the other surface of the base material 13a and one surface of the base material 13b.

As shown in FIG. 10, one surface side of the base material 13b is bonded, with an adhesive (not shown), to a surface on a side opposite to the surface facing the base material 13a, in the second layer copper foil pattern 12b and the character 15. The third layer copper foil pattern 12c is formed on the other surface of the base material 13b. The colored cover lay film 10a is bonded to a surface of the first layer copper foil pattern 12a with an adhesive (not shown), and the first layer copper foil pattern 12a is covered with the colored cover lay film 10a. The colored cover lay film 10b is bonded to a surface of the third layer copper foil pattern 12c with an adhesive (not shown), and the third layer copper foil pattern 12c is covered with the colored cover lay film 10b. Thus, the character 15 is sealed between base material 13a and the base material 13b.

As shown in FIG. 9A and 10, the opening portion 11 is formed in the colored cover lay film 10a.

As shown in FIG. 9B and 10, the character 15 is formed with the second layer copper foil in a position facing the opening portion 11 in the colored cover lay film 10a. The character 15 is formed in a region corresponding to the opening portion 11 within a longitudinal range in a direction parallel to the surface of the flexible printed circuit board 1 in the opening portion 11. Specifically, the character 15 is formed in a projection of the opening portion 11, and hence the character 15 can be visually recognized through the opening portion 11. The present embodiment uses a combination of numbers and letters (e.g., 1234 AAA) as an example of the character 15, but is not limited thereto.

As shown in FIG. 9C and 10, the copper foil pattern 12c is formed on the third layer. In FIG. 9C, the portion surrounded by a dotted line indicates a region corresponding to the opening portion 11 and the second layer character 15 in the colored cover lay film 10a, but the copper foil pattern 12c is formed also in this region on the third layer. Even if the copper foil pattern 12c is formed in a region corresponding to the opening portion 11 and the second layer character 15 in the colored cover lay film 10a, the character 15 can be visually recognized through the opening portion 11.

The character 15 can be selected from numbers, letters, symbols, marks, and a combination of any of the numbers, the letters, the symbols, and the marks. The character 15 can also be selected from a group including a fold index serving as a mark for use in folding the flexible printed circuit board 1 and a product symbol.

When the flexible printed circuit board 1 is seen from the direction of arrow A in FIG. 1, the above configuration as shown in FIG. 9D allows the character 15 formed with the second layer copper foil to be visually seen through the opening portion 11 formed on the colored cover lay film 10a.

The base material 13a corresponds to a first base material. The base material 13b corresponds to a second base material. The first layer copper foil pattern 12a corresponds to a first wiring pattern. The second layer copper foil pattern 12b corresponds to a second wiring pattern. The third layer copper foil pattern 12c corresponds to a third wiring pattern. The colored cover lay film 10a corresponds to a first opaque cover lay film. The colored cover lay film 10b corresponds to a second opaque cover lay film.

As described above, the present embodiment can provide a flexible printed circuit board having a copper foil character with good visibility and without copper foil pattern peeling.

In a sixth embodiment of the invention, the description focuses on an example assuming that the flexible printed circuit board is a two-layer board.

Figure 11A:
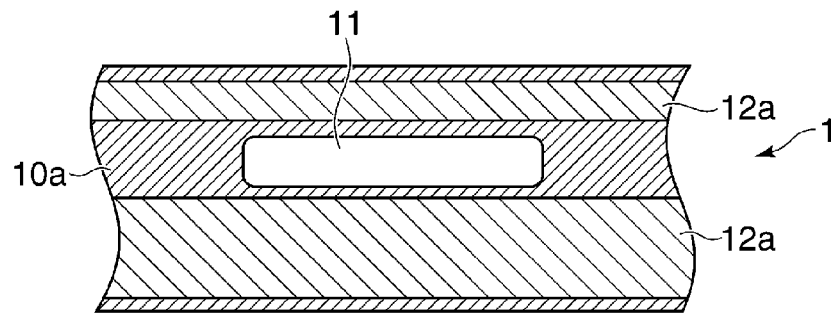
Figure 11B:
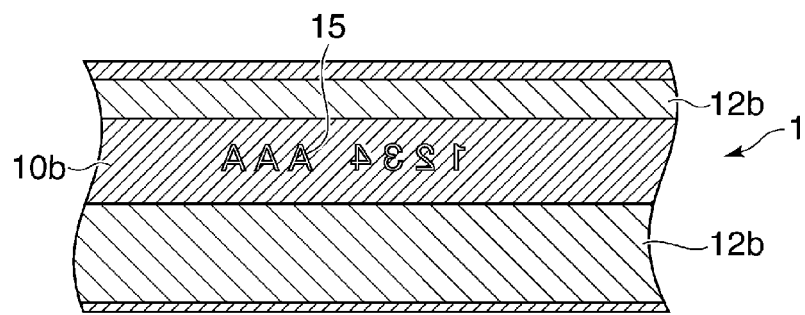
Figure 11C:
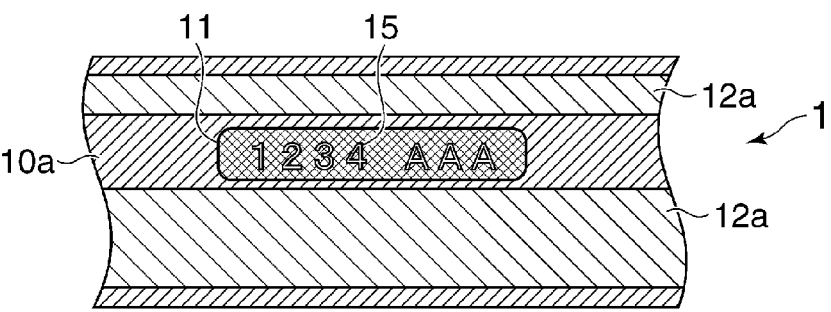
Figure 12:
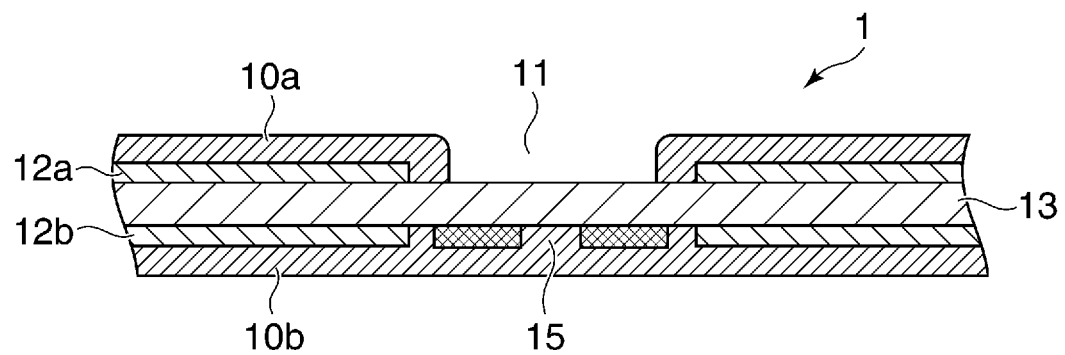
FIG. 12 is a cross-sectional view of the flexible printed circuit board according to the sixth embodiment of the present invention.

FIGS. 11A to 11C are views showing the flexible printed circuit board according to the sixth embodiment, respectively, in which FIG. 11A shows a first layer of the flexible printed circuit board as seen from the direction of arrow A in FIG. 1, FIG. 11B shows a second layer of the flexible printed circuit board as seen from the direction of arrow B in FIG. 1, and FIG. 11C is a view of the flexible printed circuit board in a state in which the first layer and the second layer are superimposed with each other as seen from the direction of arrow A in FIG. 1. FIG. 12 is a cross-sectional view of the flexible printed circuit board. In the present embodiment, the same reference numerals or characters are assigned to the members having the same functions as those in the first embodiment, descriptions of which are omitted.

In FIGS. 11A to 11C, and 12, the flexible printed circuit board 1 is configured such that copper foil patterns 12a and 12b, colored cover lay films 10a and 10b, and a character 15 are formed on a base material 13. The base material 13 is composed of a high polymer material having optical transparency such as polyimide or a synthetic resin material having optical transparency such as PET resin. A first layer copper foil pattern 12a is formed on one surface of the base material 13 and a second layer copper foil pattern 12b is formed on the other surface side of the base material 13. The character 15 is formed of hollow characters with part of the copper foil pattern 12b hollowed out. The character 15 is formed into a copper foil pattern large in area like a ground pattern of the copper foil pattern 12b. Thus, even a hollow character formed in the copper foil pattern does not impair the electrical connection of the copper foil pattern.

As shown in FIG. 12, the colored cover lay film 10a is bonded to a surface of the first layer copper foil pattern 12a with an adhesive (not shown), and the first layer copper foil pattern 12a is covered with the colored cover lay film 10a. The colored cover lay film 10b is bonded to a surface of the second layer copper foil pattern 12b with an adhesive (not shown), and the second layer copper foil pattern 12b and the character 15 are covered with the colored cover lay film 10b. The colored cover lay films 10a and 10b are colored so as to be opaque or to have extremely low optical transparency.

As shown in FIG. 11A and 12, the colored cover lay film 10a coats the first layer copper foil pattern 12a. The opening portion 11 is formed in the colored cover lay film 10a. The character 15 is formed in a region corresponding to the opening portion 11 of the colored cover lay film 10a by hollowing out part of the copper foil pattern 12b.

As shown in FIGS. 11B and 12, the second layer copper foil pattern 12b coats the character 15. The character 15 is formed in a region corresponding to the opening portion 11 within a longitudinal range in a direction parallel to the surface of the flexible printed circuit board 1 in the opening portion 11. Specifically, the character 15 is formed in a state of being sealed between the base material 13 which is transparent or has high optical transparency and the colored cover lay film 10b which is opaque or has extremely low optical transparency. The character 15 is formed in a projection of the opening portion 11, and hence the character 15 can be visually recognized through the opening portion 11. The present embodiment uses a combination of numbers and letters (e.g., 1234 AAA) as an example of the character 15, but is not limited thereto.

The character 15 can be selected from numbers, letters, symbols, marks, and a combination of any of the numbers, the letters, the symbols, and the marks. The character 15 can also be selected from a fold index serving as a mark for use in folding the flexible printed circuit board 1 and a product symbol. The character 15 is formed such that the numbers and the letters are seen with left and right reversed as viewed from the direction of arrow B in FIG. 1.

The first layer copper foil pattern 12a corresponds to a wiring pattern. The second layer copper foil pattern 12b corresponds to another wiring pattern. The colored cover lay film 10a corresponds to a first opaque cover lay film. The colored cover lay film 10b corresponds to a second opaque cover lay film.

When the flexible printed circuit board 1 is seen from the direction of arrow A in FIG. 1, the above configuration as shown in FIG. 11C allows the character 15 formed with the second layer copper foil to be visually seen through the opening portion 11 formed on the colored cover lay film 10a. The character 15 is sealed between the base material 13 and the colored cover lay film 10b, which prevents the character 15 from being peeled off.

As described above, the present embodiment can provide a flexible printed circuit board having a copper foil character with good visibility and without copper foil pattern peeling.

In a seventh embodiment of the invention, the description focuses on an example assuming that the flexible printed circuit board is a three-layer board.

Figure 13A:
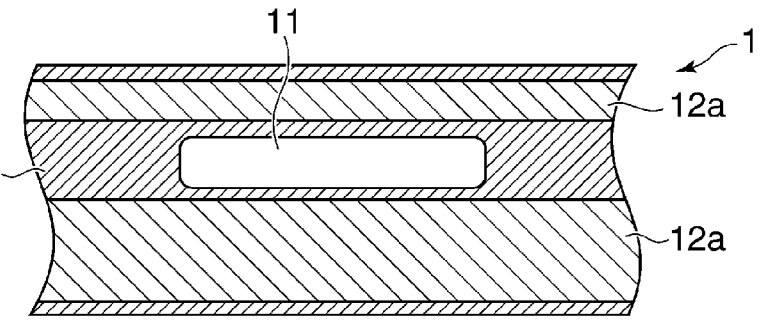
Figure 13B:
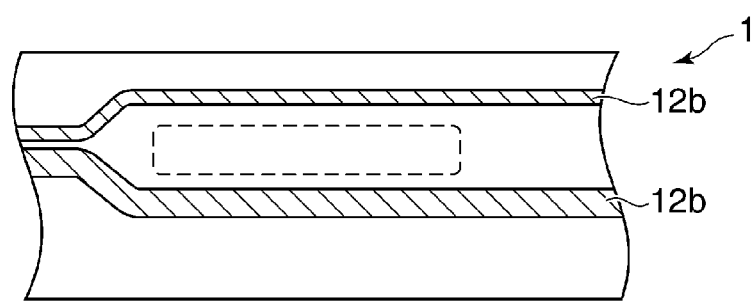
Figure 13C:
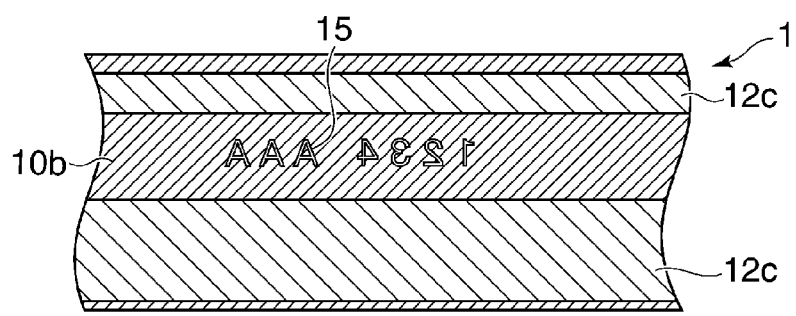
Figure 13D:
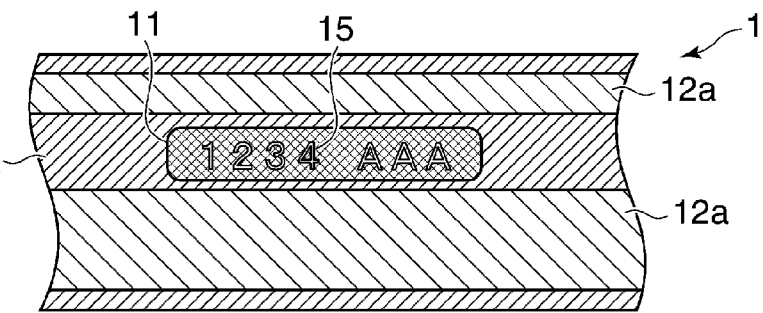
Figure 14:
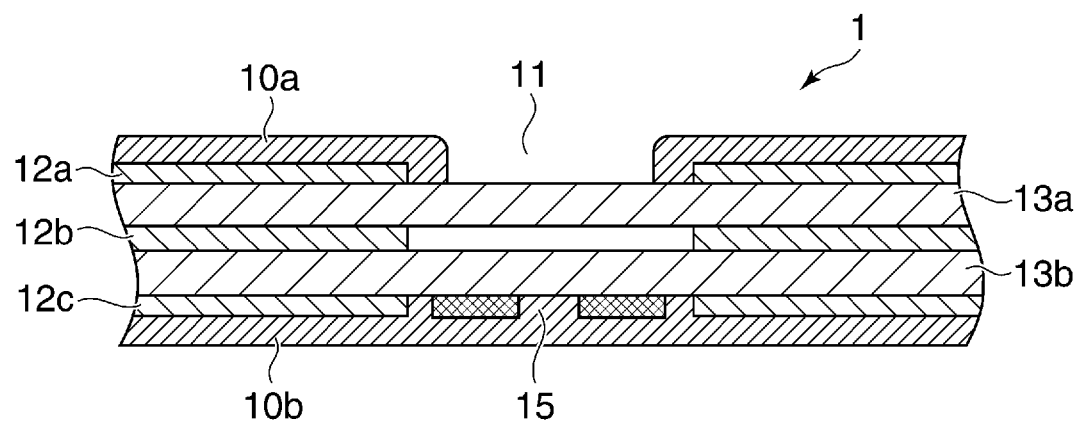
FIG. 14 is a cross-sectional view of the flexible printed circuit board according to the seventh embodiment of the present invention.

FIGS. 13A to 13D are views showing the flexible printed circuit board according to the seventh embodiment, respectively, in which FIG. 13A shows a first layer of the flexible printed circuit board as seen from the direction of arrow A in FIG. 1, FIG. 13B shows a second layer of the flexible printed circuit board as seen from the direction of arrow A in FIG. 1, FIG. 13C shows a third layer of the flexible printed circuit board as seen from the direction of arrow B in FIG. 1, and FIG. 13D is a view of the flexible printed circuit board in a state in which the first layer, the second layer, and the third layer are superimposed with one another as seen from the direction of arrow A in FIG. 1. FIG. 14 is a cross-sectional view of the flexible printed circuit board. In the present embodiment, the same reference numerals or characters are assigned to the members having the same functions as those in the first embodiment, descriptions of which are omitted.

In FIGS. 13A to 13D, and 14, the flexible printed circuit board 1 is configured such that the copper foil patterns 12a, 12b, and 12c, the colored cover lay films 10a and 10b, and the character 15 are formed on the base materials 13a and 13b. The base materials 13a and 13b are composed of a high polymer material having optical transparency such as polyimide or a synthetic resin material having optical transparency such as PET resin. The first layer copper foil pattern 12a is formed on one surface of the base material 13a and the second layer copper foil pattern 12b is formed on the other surface of the base material 13a. It should be noted that the base material 13b is disposed on the other surface side of the base material 13a.

One surface of the base material 13b is bonded, with an adhesive (not shown), to a surface on a side opposite to the surface facing the base material 13a, in the second layer copper foil pattern 12b. The third layer copper foil pattern 12c is formed on the other surface of the base material 13b. The character 15 is formed of hollow characters with part of the copper foil pattern 12c hollowed out. The character 15 is formed into a copper foil pattern large in area like a ground pattern of the copper foil pattern 12c. Thus, even a hollow character formed in the copper foil pattern does not impair the electrical connection of the copper foil pattern.

As shown in FIG. 14, the colored cover lay film 10a is bonded to a surface of the first layer copper foil pattern 12a with an adhesive (not shown), and the first layer copper foil pattern 12a is covered with the colored cover lay film 10a. The colored cover lay film 10b is bonded to a surface of the third layer copper foil pattern 12c with an adhesive (not shown), and the third layer copper foil pattern 12c and the character 15 are covered with the colored cover lay film 10b. Thus, the character 15 is sealed between the base material 13b and the colored cover lay film 10b.

As shown in FIG. 13A and 14, the opening portion 11 is formed in the colored cover lay film 10a. As shown in FIG. 13B and 14, the second layer copper foil pattern 12b in a position facing the opening portion 11 in the colored cover lay film 10a is routed so as to avoid (bypass) a region corresponding to the opening portion 11. As shown in FIG. 13C and 14, the character 15 is formed in the third layer copper foil pattern 12c at a position facing the opening portion 11 of the colored cover lay film 10a by hollowing out part of the copper foil pattern 12c. The character 15 is formed in a region corresponding to the opening portion 11 within a longitudinal range in a direction parallel to the surface of the flexible printed circuit board 1 in the opening portion 11. Specifically, the character 15 is formed in a projection of the opening portion 11, the second layer copper foil pattern 12b is formed so as to bypass the region corresponding to the opening portion 11, and hence the character 15 can be visually recognized through the opening portion 11. The present embodiment uses a combination of numbers and letters (e.g., 1234 AAA) as an example of the character 15, but is not limited thereto.

The character 15 can be selected from numbers, letters, symbols, marks, and a combination of any of the numbers, the letters, the symbols, and the marks. The character 15 can also be selected from a group including a fold index serving as a mark for use in folding the flexible printed circuit board 1 and a product symbol. The character 15 is formed such that the numbers and the letters are seen with left and right reversed as viewed from the direction of arrow B in FIG. 1.

When the flexible printed circuit board 1 is seen from the direction of arrow A in FIG. 1, the above configuration as shown in FIG. 13D allows the character 15 formed with the third layer copper foil to be visually seen through the opening portion 11 formed on the colored cover lay film 10a.

The base material 13a corresponds to a first base material. The base material 13b corresponds to a second base material. The first layer copper foil pattern 12a corresponds to a first wiring pattern. The second layer copper foil pattern 12b corresponds to a second wiring pattern. The third layer copper foil pattern 12c corresponds to a third wiring pattern. The colored cover lay film 10a corresponds to a first opaque cover lay film. The colored cover lay film 10b corresponds to a second opaque cover lay film.

As described above, the present embodiment can provide a flexible printed circuit board having a copper foil character with good visibility and without copper foil pattern peeling.

In an eighth embodiment of the invention, the description focuses on an example assuming that the flexible printed circuit board is a three-layer board.

Figure 15A:
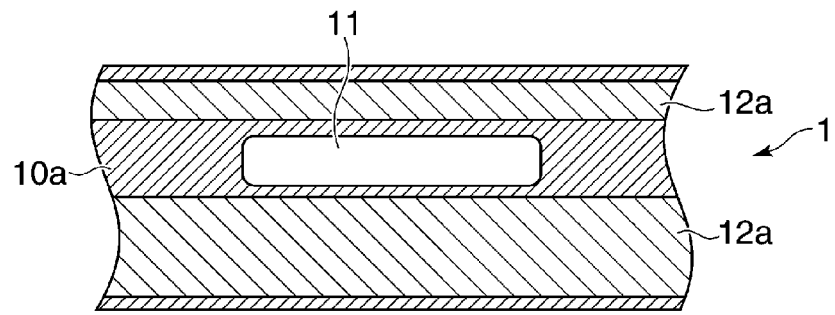
Figure 15B:
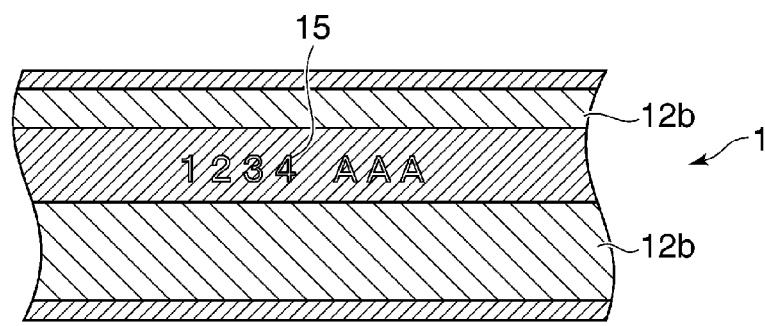
Figure 15C:
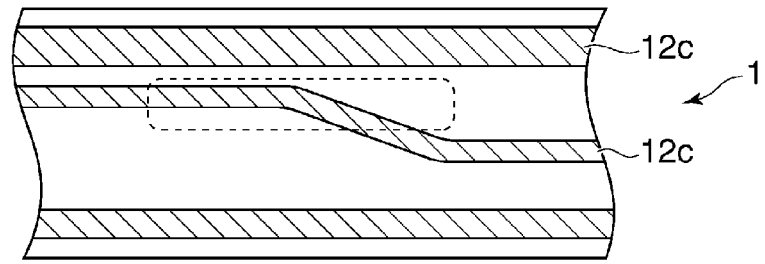
Figure 15D:
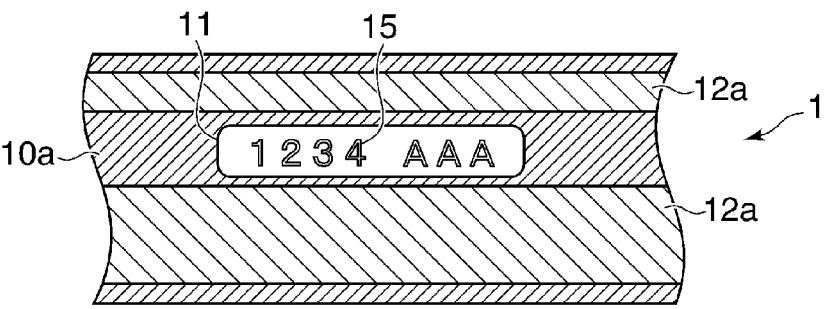

FIGS. 15A to 15D are views showing the flexible printed circuit board according to the eighth embodiment, respectively, in which FIG. 15A shows a first layer of the flexible printed circuit board as seen from the direction of arrow A in FIG. 1, FIG. 15B shows a second layer of the flexible printed circuit board as seen from the direction of arrow A in FIG. 1, FIG. 15C shows a third layer of the flexible printed circuit board as seen from the direction of arrow A in FIG. 1, and FIG. 15D is a view of the flexible printed circuit board in a state in which the first layer, the second layer, and the third layer are superimposed with one another as seen from the direction of arrow A in FIG. 1.

Figure 16:
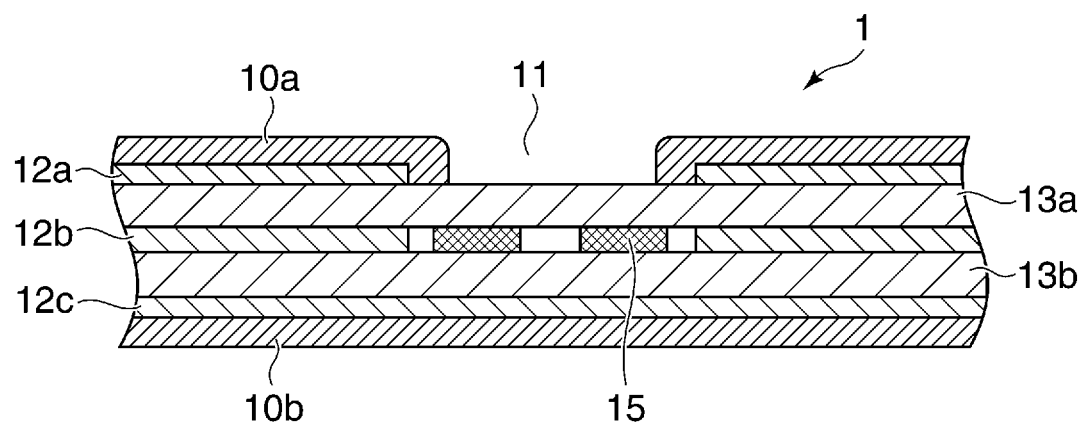
FIG. 16 is a cross-sectional view of the flexible printed circuit board according to the eighth embodiment of the present invention.

FIG. 16 is a cross-sectional view of the flexible printed circuit board according to the eighth embodiment. In the present embodiment, the same reference numerals or characters are assigned to the members having the same functions as those in the first embodiment, descriptions of which are omitted.

In FIGS. 15A to 15D, and 16, the flexible printed circuit board 1 is configured such that the copper foil patterns 12a, 12b, and 12c, the colored cover lay films 10a and 10b, and the character 15 are formed on the base materials 13a and 13b. The base materials 13a and 13b are composed of a high polymer material having optical transparency such as polyimide or a synthetic resin material having optical transparency such as PET resin.

As shown in FIG. 16, the first layer copper foil pattern 12a is formed on one surface of the base material 13a and the second layer copper foil pattern 12b is formed on the other surface of the base material 13a. The base material 13b is disposed on the other surface of the base material 13a. In other words, the second layer copper foil pattern 12b is formed between the other surface of the base material 13a and one surface of the base material 13b.

The character 15 is formed of hollow characters with part of the copper foil pattern 12b hollowed out. The character 15 is formed into a copper foil pattern large in area like a ground pattern of the copper foil pattern 12b. Thus, even a hollow character formed in the copper foil pattern does not impair the electrical connection of the copper foil pattern.

As shown in FIG. 16, one surface side of the base material 13b is bonded, with an adhesive (not shown), to a surface on a side opposite to the surface facing the base material 13a, in the second layer copper foil pattern 12b and the character 15. The third layer copper foil pattern 12c is formed on the other surface side of the base material 13b. The colored cover lay film 10a is bonded to a surface of the first layer copper foil pattern 12a with an adhesive (not shown), and the first layer copper foil pattern 12a is covered with the colored cover lay film 10a. The colored cover lay film 10b is bonded to a surface of the third layer copper foil pattern 12c with an adhesive (not shown), and the third layer copper foil pattern 12c is covered with the colored cover lay film 10b. Thus, the character 15 is sealed between base material 13a and the base material 13b.

As shown in FIG. 15A and 16, the opening portion 11 is formed in the colored cover lay film 10a.

As shown in FIG. 15B and 16, the character 15 is formed at a position facing the opening portion 11 of the colored cover lay film 10a by hollowing out part of the second layer copper foil pattern 12b. The character 15 is formed in a region corresponding to the opening portion 11 within a longitudinal range in a direction parallel to the surface of the flexible printed circuit board 1 in the opening portion 11. Specifically, the character 15 is formed in a projection of the opening portion 11, and hence the character 15 can be visually recognized through the opening portion 11. The present embodiment uses a combination of numbers and letters (e.g., 1234 AAA) as an example of the character 15, but is not limited thereto.

As shown in FIG. 15C and 16, the copper foil pattern 12c is formed on the third layer. In FIG. 15C, the portion surrounded by a dotted line indicates a region corresponding to the opening portion 11 and the second layer character 15 in the colored cover lay film 10a, but the copper foil pattern 12c is formed also in this region on the third layer. Even if the copper foil pattern 12c is formed in a region corresponding to the opening portion 11 and the second layer character 15 in the colored cover lay film 10a, the character 15 can be visually recognized through the opening portion 11.

The character 15 can be selected from numbers, letters, symbols, marks, and a combination of any of the numbers, the letters, the symbols, and the marks.

The character 15 can also be selected from a group including a fold index serving as a mark for use in folding the flexible printed circuit board 1 and a product symbol.

When the flexible printed circuit board 1 is seen from the direction of arrow A in FIG. 1, the above configuration as shown in FIG. 15D allows the character 15 formed with the second layer copper foil to be visually seen through the opening portion 11 formed on the colored cover lay film 10a.

The base material 13a corresponds to a first base material. The base material 13b corresponds to a second base material. The first layer copper foil pattern 12a corresponds to a first wiring pattern. The second layer copper foil pattern 12b corresponds to a second wiring pattern. The third layer copper foil pattern 12c corresponds to a third wiring pattern. The colored cover lay film 10a corresponds to a first opaque cover lay film. The colored cover lay film 10b corresponds to a second opaque cover lay film.

As described above, the present embodiment can provide a flexible printed circuit board having a copper foil character with good visibility and without copper foil pattern peeling.

The first to the eighth embodiment have described examples such that the flexible printed circuit board is configured as a two-layer board or a three-layer board, but without being limited thereto, the flexible printed circuit board may be configured as a board having a plurality of layers of four or more layers without any problem.

The first to the eighth embodiment have not mentioned the type of the electronic device incorporating the flexible printed circuit board, but the present invention can be applied to various electronic devices such as a camera.

Aspects of the present invention can also be realized by a computer of a system or apparatus (or devices such as a CPU or MPU) that reads out and executes a program recorded on a non-transitory memory device to perform the functions of the above-described embodiment(s), and by a method, the steps of which are performed by a computer of a system or apparatus by, for example, reading out and executing a program recorded on a non-transitory memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-282789 filed Dec. 26, 2012 and Japanese Patent Application No. 2013-223342 filed Oct. 28, 2013, which are hereby incorporated by reference herein in its entirety.

What is claimed is:

1. A flexible printed circuit board having a plurality of layers, the flexible printed circuit board comprising:
a base material having optical transparency;
a first wiring pattern formed on one surface of the base material;
a first opaque cover lay film covering a surface of the first wiring pattern;
a second wiring pattern and a character formed on the other surface of the base material; and
a second opaque cover lay film covering a surface of the second wiring pattern and the character,
wherein the first opaque cover lay film has an opening portion formed therein,
wherein the first opaque cover lay film covers the one surface of the base material around the opening portion where the first wiring pattern is not formed,
wherein the second opaque cover lay film covers the other surface of the base material where neither the second wiring pattern nor the character is formed, and
wherein the opening portion is formed so that he character is visible through the opening portion.

2. The flexible printed circuit board according to claim 1, wherein the character is formed by hollowing out part of another wiring pattern formed on the other surface of the base material.

3. The flexible printed circuit board according to claim 1, wherein the opening, portion reaches an outer peripheral edge of the flexible printed circuit board, and
wherein the character is larger than the opening portion and reaches the outer peripheral edge of the flexible printed circuit board.

4. The flexible printed circuit board according to claim 1, wherein the character is selected from numbers, letters, symbols, marks, and a combination of any of the numbers, the letters, the symbols, and the marks.

5. The printed circuit board according to claim 1, wherein the character is elected from a group including a fold index serving mark for use in folding the flexible printed circuit board and a product symbol.

6. The flexible printed circuit board according, to claim 5, wherein in a case where the character is any of numbers, letters, symbols, and a combination of numbers, the letters, and the symbols, the character is reversely formed as viewed from one surface of the flexible printed circuit board.

7. An electronic device comprising the flexible printed circuit board according to claim 1.

8. A flexible printed circuit board having a plurality of layers, the flexible, printed circuit board comprising:
a first base material having optical transparency;
a first wiring pattern formed on one surface of the first base material;
a first opaque cover lay film covering a surface of the first wiring pattern;
second base material having optical transparency, and disposed on the other surface of the first base material;
a second wiring pattern formed between the other surface of the first base material and on one surface of the second base material;
a third wiring pattern and a character formed on the other surface of the second base material; and
a second opaque cover lay film covering a surface of the third wiring pattern and the character,
wherein the first opaque cover lay film has an opening portion formed therein,
wherein the first opaque cover lay film covers the one surface of the first base material around the opening portion where the first wiring pattern is not formed,
wherein the second opaque cover lay film covers the other surface of the second base material where neither the second wiring pattern nor the character is formed and
wherein the second, wiring pattern is routed to avoid a region overlapping with the opening portion and
wherein the opening portion is formed so that the character is visible through the opening portion.

9. The flexible printed circuit board according to claim 8, wherein the character is formed by hollowing out part of a third wiring pattern formed on the other surface of the second base material.

10. The flexible printed circuit board according to claim 8, wherein the character is selected from numbers, letters, symbols, marks, and a combination of any of the numbers, the letters, the symbols, and the marks.

11. The flexible printed circuit board according to claim 8, wherein the character is selected from a group including a fold index serving as a mark for use in folding the flexible printed circuit board and a product symbol.

12. The flexible printed circuit board according to claim 11, wherein in a case where the character is any of numbers, letters, symbols, and a combination of the numbers, the letters, and the symbols the character is reversely formed as viewed from one surface of the flexible printed circuit board.

13. An electronic device comprising the flexible printed circuit board according to claim 8.

14. A flexible printed circuit board having a plurality of layers, the flexible printed circuit board comprising:
a first base material having optical transparency:
first wiring pattern formed on one surface of the first base material;
a first opaque cover lay film covering a surface of the first wiring pattern;
a second base material having optical transparency and disposed on the other surface of the first base material;
a second wiring pattern and a character formed between the other surface of he first base material and on one surface of the second base material; and
a second opaque cover lay film covering a surface of the second wiring pattern and the character,
wherein the first opaque cover lay film has an opening portion formed therein,
wherein the first opaque cover lay film covers the one surface of the first base material around the opening portion where the first wiring pattern is not formed, and
wherein the opening portion is formed so that the character is visible through the opening portion.

15. The flexible printed circuit board according to claim 14. wherein the character is formed by hollowing out part of a second wiring pattern formed between the other surface of the first base material and the one surface of the second base material.

16. The flexible printed circuit board according to claim 14, wherein the character is selected from numbers, letters, symbols, marks, and a combination of any of the numbers, the letters, the symbols , and the marks.

17. The flexible printed circuit board according to claim 14, wherein the character is selected from a group including a fold index serving a mark for use in folding the flexible printed circuit board and a product symbol.

18. The flexible printed circuit board according to claim 17, wherein in a case where the character is any of numbers, letters, symbols, and a combination of the numbers, the letters, and the symbols, the character is reversely formed as viewed from one surface of the flexible printed circuit board.

19. An electronic device comprising the flexible printed circuit board according to claim 14.

* * * * *